(12) United States Patent
Chan et al.

(10) Patent No.: US 7,863,161 B2
(45) Date of Patent: Jan. 4, 2011

(54) METHOD OF CUTTING A WAFER

(75) Inventors: Dae-Sang Chan, Asan-si (KR);
Jun-Young Ko, Cheonan-si (KR);
Wha-Su Sin, Cheonan-si (KR);
Jae-Yong Park, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 174 days.

(21) Appl. No.: 12/138,646

(22) Filed: Jun. 13, 2008

(65) Prior Publication Data
US 2008/0311727 A1 Dec. 18, 2008

(30) Foreign Application Priority Data
Jun. 13, 2007 (KR) .................. 10-2007-0057952

(51) Int. Cl.
*H01L 21/00* (2006.01)
(52) U.S. Cl. ............... 438/464; 438/460; 438/461; 438/462; 438/463; 438/465; 438/110; 438/111; 438/112; 438/113; 438/114
(58) Field of Classification Search ......... 438/460–465, 438/110–114
See application file for complete search history.

(56) References Cited

U.S. PATENT DOCUMENTS

| 5,110,388 | A | * | 5/1992 | Komiyama et al. ......... 156/229 |
| 5,118,567 | A | * | 6/1992 | Komiyama et al. ......... 428/345 |
| 5,316,853 | A | * | 5/1994 | Shibata et al. .............. 428/416 |
| 6,007,920 | A | * | 12/1999 | Umehara et al. .......... 428/473.5 |
| 7,060,531 | B2 | * | 6/2006 | Arita ........................... 438/114 |
| 7,129,114 | B2 | * | 10/2006 | Akram ....................... 438/110 |
| 2003/0020142 | A1 | * | 1/2003 | Wachtler .................... 257/620 |
| 2005/0250296 | A1 | | 11/2005 | Yamamura et al. |
| 2006/0003550 | A1 | * | 1/2006 | Periasamy et al. .......... 438/459 |
| 2006/0030129 | A1 | * | 2/2006 | Ohmiya et al. ............. 438/462 |
| 2006/0035444 | A1 | * | 2/2006 | Nakamura et al. .......... 438/464 |
| 2006/0166466 | A1 | * | 7/2006 | Maki et al. .................. 438/464 |
| 2007/0249145 | A1 | * | 10/2007 | Nakamura ................... 438/464 |
| 2007/0275541 | A1 | * | 11/2007 | Harris et al. ................. 438/460 |

FOREIGN PATENT DOCUMENTS

| JP | 2006-294913 | 10/2006 |
| JP | 2006-303077 | 11/2006 |

\* cited by examiner

*Primary Examiner*—Ha Tran T Nguyen
*Assistant Examiner*—Karen M Kusumakar
(74) *Attorney, Agent, or Firm*—Stanzione & Kim LLP

(57) ABSTRACT

In a method of cutting a wafer, a supporting member is attached to an upper surface of the wafer on which semiconductor chips are formed. An opening is formed at a lower surface of the wafer along a scribe lane of the wafer. The lower surface of the wafer may be plasma-etched to reduce a thickness of the wafer. A tensile tape may be attached to the lower surface of the wafer. Here, the tensile tape includes sequentially stacked tensile films having different tensile modules. The supporting member is then removed. The tensile tape is cooled to increase the tensile modules between the tensile films. The tensile tape is tensed until the tensile films are cut using the tensile modules difference to separate the tensile tape from the semiconductor chips. Thus, the lower surface of the wafer may be plasma-etched without using an etching mask.

13 Claims, 4 Drawing Sheets

METHOD OF CUTTING A WAFER

CROSS-REFERENCE TO RELATED APPLICATIONS

This application claims priority under 35 U.S.C. §119 to Korean Patent Application No. 2007-57952 filed on Jun. 13, 2007 in the Korean Intellectual Property Office (KIPO), the contents of which are herein incorporated by reference in their entirety.

BACKGROUND OF THE INVENTION

1. Field of the Invention

Example embodiments of the present general inventive concept relate to a method of cutting a wafer. More particularly, example embodiments of the present general inventive concept relate to a method of cutting a wafer having a plurality of semiconductor chips along a scribe lane of the wafer.

2. Description of the Related Art

Generally, various semiconductor processes may be performed on a wafer to form a plurality of semiconductor chips. To mount the semiconductor chips on a printed circuit board (PCB), a packaging process may be performed on the wafer to form semiconductor packages.

According to a conventional packaging method, a wafer may be cut along a scribe lane of the wafer to divide the wafer into each of the semiconductor chips. The semiconductor chips may each be attached to a wiring substrate. The wiring substrate may be electrically connected to a bonding pad of the respective semiconductor chip using a conductive wire. A molding member may be formed on the wiring substrate to surround the semiconductor chip. An outer terminal, such as a solder ball, may be mounted on the wiring substrate.

However, since the conventional packaging method may be performed on each of the semiconductor chips, the conventional packaging method may have very low process efficiency.

To overcome the above-mentioned problem, a wafer level packaging method may be proposed. According to the wafer level packaging process, a packaging process may be performed on a wafer before cutting the wafer. The wafer may then be cut.

The wafer may be cut by an etching process, a laser cutting process, etc. According to the etching process, an etching mask may be formed on the wafer. The wafer may be etched using the etching mask to divide the wafer into separate semiconductor chips. However, the conventional etching process may include a process for forming the etching mask, a process for removing the etching mask after the etching process, a process for removing byproducts, etc. Thus, costs and time for cutting the wafer may be increased.

In contrast, according to the laser cutting process, a laser may be irradiated to a wafer without an etching mask to divide the wafer into semiconductor chips. However, the laser irradiated to the wafer may generate high heat, such that this high heat may have bad influences on silicon in the wafer so that the strength of the semiconductor chip may be reduced.

SUMMARY OF THE INVENTION

The present general inventive concept provides a method of cutting a wafer that is capable of suppressing damages to the wafer without using an etching mask.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of cutting a wafer in which a supporting member is attached to an upper surface of the wafer on which semiconductor chips are formed. Further, an opening may be formed at a lower surface of the wafer along a scribe lane of the wafer. The lower surface of the wafer may be plasma-etched to reduce a thickness of the wafer. A tensile tape may be attached to the lower surface of the wafer. Here, the tensile tape includes sequentially stacked tensile films having different tensile modules. The supporting member is then removed. The tensile tape is cooled to increase the tensile modules between the tensile films. The tensile tape is tensed until the tensile films are cut using the tensile modules difference to separate the tensile tape from the semiconductor chips.

The method may further include partially removing the lower surface of the wafer supported by the supporting member to reduce the thickness of the wafer. Further, the lower surface of the wafer may be removed by a polishing process.

The method may further include detecting positions of the semiconductor chips to identify a position of the scribe lane. Further, detecting the positions of the semiconductor chips may include irradiating an infra-red ray to the wafer.

The forming the opening may include forming a preliminary opening, which does not expose the supporting member, from the lower surface of the wafer. Further, plasma-etching the lower surface of the wafer may include removing a portion of the wafer through the preliminary opening to form the opening for exposing the supporting member. In contrast, the opening may be formed through the wafer to expose the supporting member. Here, the opening may be formed by a laser cutting process.

The tensile tape may be cooled to a temperature of no more than about 10° C.

According to an exemplary embodiment, after forming the opening at the scribe lane of the wafer using the laser, the lower surface of the wafer may be plasma-etched. Thus, the lower surface of the wafer may be plasma-etched without an etching mask. Further, damages to the wafer caused by high heat of the laser may be cured by the plasma-etching process. Additionally, since the tensile tape may be cooled and then tensed, the tensile tape may not be adhered to the wafer.

The foregoing and/or other aspects and utilities of the present general inventive concept may be achieved by providing a method of cutting a wafer, including attaching a supporting member on an upper surface of the wafer having a plurality of semiconductor chips; laser cutting a plurality of openings to a predetermined depth at a lower surface of the wafer along a scribe lane of the wafer; plasma-etching the lower surface of the wafer to reduce a thickness of the wafer; attaching a material having two layers each of a different tensile modulus to the lower surface of the wafer; removing the supporting member; and cooling the material to increase the tensile modulus difference between the two layers to separate the two layers from the semiconductor chips.

The foregoing and/or other aspects and utilities of the present general inventive concept may be achieved by providing a method of cutting a wafer, including: attaching a supporting member on an upper surface of the wafer having a plurality of semiconductor chips embedded therein; laser cutting a plurality of openings partly through the wafer at a lower surface thereof along a scribe lane of the wafer; plasma-etching the lower surface of the wafer to reduce a thickness of the wafer while simultaneously extending the openings cut therein to the supporting member; and removing the supporting member from the semiconductor chips.

The method may further include attaching a material having two layers each of a different tensile modulus to the lower surface of the wafer before removing the supporting member; and decreasing the temperature of the material having two layers to increase the tensile modulus difference between the two layers to separate the two layers from the semiconductor chips.

BRIEF DESCRIPTION OF THE DRAWINGS

The above and other features and utilities of the present general inventive concept will become readily apparent by reference to the following detailed description when considered in conjunction with the accompanying drawings, wherein.

DETAILED DESCRIPTION OF THE PREFERRED EMBODIMENTS

Figure 1:
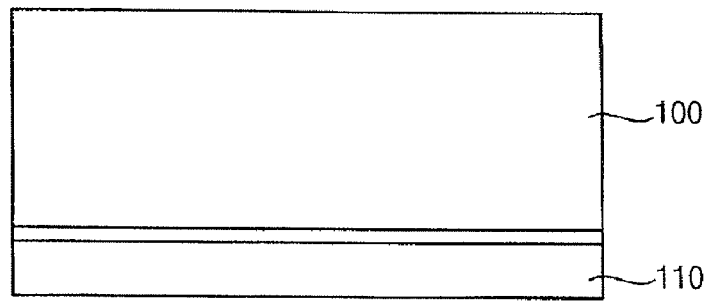
FIGS. 1 to 9 are cross-sectional views illustrating a method of cutting a wafer in accordance with an exemplary embodiment of the present general inventive concept.

The present general inventive concept is described more fully hereinafter with reference to the accompanying drawings, in which example embodiments of the present invention are shown. The present general inventive concept may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example Embodiment 1

FIGS. 1 to 9 are cross-sectional views illustrating a method of cutting a wafer in accordance with an exemplary embodiment of the present general inventive concept.

Referring to FIG. 1, a wafer 100 having a plurality of semiconductor chips (not shown) is prepared. In this example embodiment, a packaging process may be performed on the wafer to form a plurality of semiconductor packages in the wafer 100. Particularly, a first insulation layer pattern (not shown) having an opening is formed on an upper surface of the wafer 100 to expose a bonding pad (not shown) of the semiconductor chip through the opening. A conductive layer pattern (not shown) is formed on the first insulation layer pattern to connect the bonding pad to the conductive layer pattern. An outer terminal, such as a solder ball, is mounted on an exposed end portion of the conductive layer pattern. Here, the outer terminal may be formed on the semiconductor chip after cutting the wafer 100. Alternatively, other packages having a structure different from the above-mentioned structure may be formed on the wafer 100.

A supporting member 110 is attached to the upper surface of the wafer 100. In this example embodiment, the supporting member 110 may support the wafer during a following cutting process. The supporting member 110 may include an insulation tape. The wafer 100 is then reversed to orient the supporting member 110 toward a downward direction.

Figure 2:
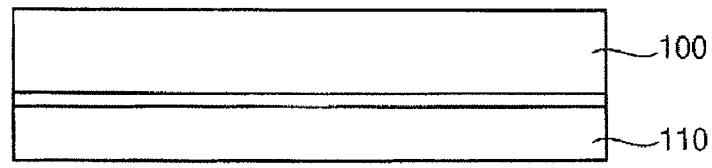

Referring to FIG. 2, a lower surface of the wafer 100 oriented toward an upward direction is partially removed to primarily reduce a thickness of the wafer 100. In this example embodiment, the lower surface of the wafer 100 may be removed by a polishing process.

Figure 3:
Figure 3:
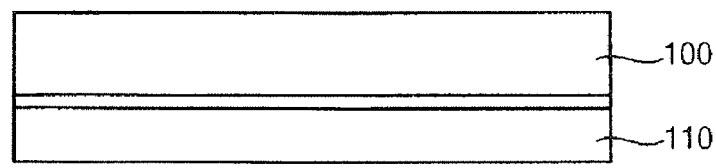

Referring to FIG. 3, positions of the semiconductor chips are detected to identify a scribe lane of the wafer 100. Here, the wafer 100 may be cut along a scribe lane to divide the wafer into the separate semiconductor chips. In this example embodiment, an infra-red ray may be irradiated toward the wafer 100 to detect the positions of the semiconductor chips.

Particularly, the semiconductor chips may include a plurality of patterns. In contrast, patterns may not be formed in the scribe lane. Thus, when the infrared ray is irradiated toward the semiconductor chips and the scribe lane, reflected infrared rays from the semiconductor chips and the scribe lane may have different characteristics. The different characteristics of the reflected infrared rays may be analyzed to detect positions of the wafer where the patterns are formed and other positions of the wafer where the patterns are not formed, thereby identifying the position of the scribe lane.

Figure 4:
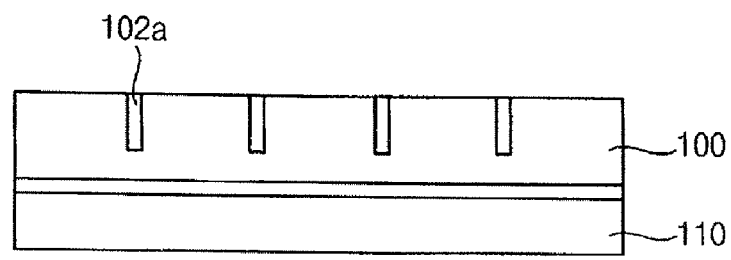

Referring to FIG. 4, a preliminary opening 102a is formed through the lower surface of the wafer 100 along the scribe lane. In this example embodiment, the preliminary opening 102a may have a depth less than a thickness of the wafer 100 so that the supporting member 110 may not be exposed through the preliminary opening 102a. Further, the preliminary opening 102a may be formed at the lower surface of the wafer 100 by a laser cutting process. Here, a high heat generated during the laser cutting process may damage the wafer 100.

Figure 5:
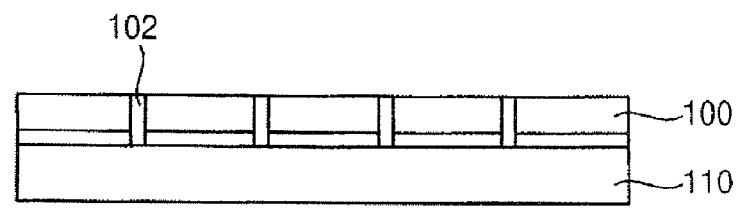

Referring to FIG. 5, the lower surface of the wafer 100 is plasma-etched to secondarily reduce the thickness of the wafer. Simultaneously, a portion of the wafer 100 that is exposed through the preliminary opening 102a is removed to form an opening 102 which exposes portions of the supporting member 110. In other words, as the thickness of the wafer 100 is being reduced by a plasma-etching process, the portions of the wafer 100 within the preliminary opening 102a are also etched toward the supporting member 110. In this example embodiment, the entire lower surface of the wafer 100 may be plasma-etched without an etching mask. Therefore, the method according to this example embodiment does not require a process to form the etching mask, a process to remove the etching mask, a process to remove byproducts, etc. As a result, a wafer may be cut at a low cost and in a faster time period. Here, the wafer 100 may be completely cut along the opening 102 so that the semiconductor chips embedded therein may be separated from each other. Alternatively, the separated semiconductor chips may be adhered to the supporting member 110.

Here, portions of the wafer 100 that may become damaged during the laser cutting process may be cured by the plasma-etching process. Thus, the separated semiconductor chips may have a strong mechanical strength. Further, since the wafer 100 includes silicon, an etching gas used in the plasma-etching process may include a fluorine-based gas. Additionally, other etching gases may be used in the plasma-etching process in accordance with types of the semiconductor chips formed by particular materials.

Figure 6:
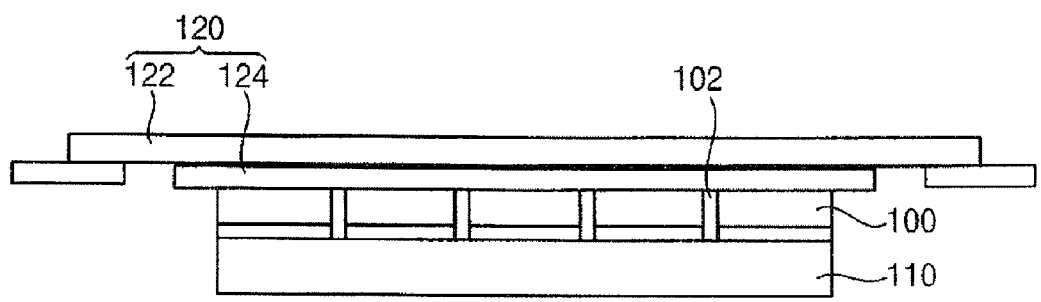

Referring to FIG. 6, a tensile tape 120 may be attached to the lower surface of the wafer 100. In this example embodiment, the tensile tape 120 may include a first tensile film 122 and a second tensile film 124 stacked on the first tensile film 122. The second tensile film 124 is to be attached to the lower surface of the wafer 100. Here, the first tensile film 122 and the second tensile film 124 may have a different tensile modulus with respect to each other. Thus, a tensile modulus difference may exist between the first tensile film 122 and the second tensile film 124. In this example embodiment, the first tensile film 122 may include a polymer and the second tensile film 124 may include a copolymer. It is to be noted that materials other than a tensile tape 120 having a tensile modulus difference may be used which perform the intended purposes as described herein.

Figure 7:
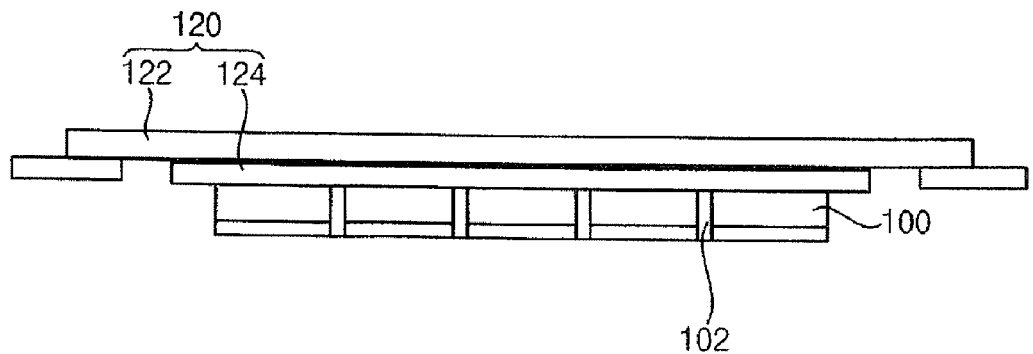

Referring to FIG. 7, the supporting member 110 may then removed from the wafer 100. In the case of using the tensile tape 120, the separated semiconductor chips are attached to the tensile tape 120.

Figure 8:
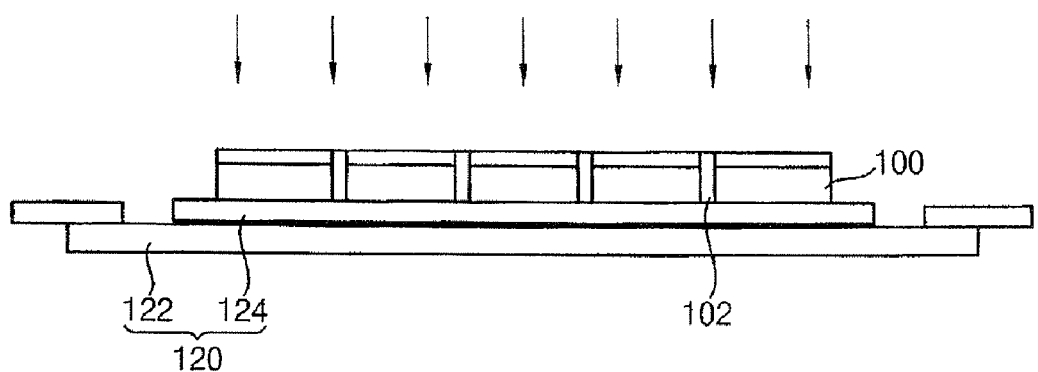

Referring to FIG. 8, the tensile tape 120 may be cooled to increase the tensile modulus difference between the first tensile film 122 and the second tensile film 124. In this example embodiment, the tensile tape 120 may be cooled to a temperature of approximately 10° C.

Figure 9:
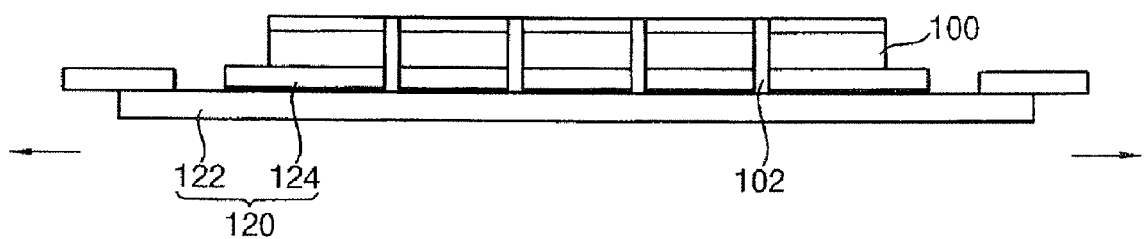

Referring to FIG. 9, the tensile tape 120 is tensed in both directions to remove the tensile tape 120 from the separated semiconductor chips. In this example embodiment, the second tensile film 124 including the copolymer may have the tensile modulus higher than that of the first tensile film 122 including the polymer. Thus, when the tensile tape 120 is tensed, the second tensile film 124 may be more expanded as compared to the first tensile film 122 so that the tensile tape 120 may be readily cut along the scribe lane 102.

Here, the tensile modulus difference between the first tensile film 122 and the second tensile film 124 may be greatly increased by cooling the tensile tape 120. Therefore, the tensile tape 120 may be easily separated from the semiconductor chips, and are not adhered to the semiconductor chips.

According to this example embodiment, the lower surface of the wafer 100 may be plasma-etched, after forming the opening at the scribe lane of the wafer using the laser. Thus, the wafer may be plasma-etched without using an etching mask. Further, the portions of the wafer affected by the high heat of the laser may be cured by the plasma-etching process. Additionally, since the tensile tape may be tensed after cooling the tensile tape, the tensile tape may not be adhered to the wafer 100.

Example Embodiment 2

Figure 10:
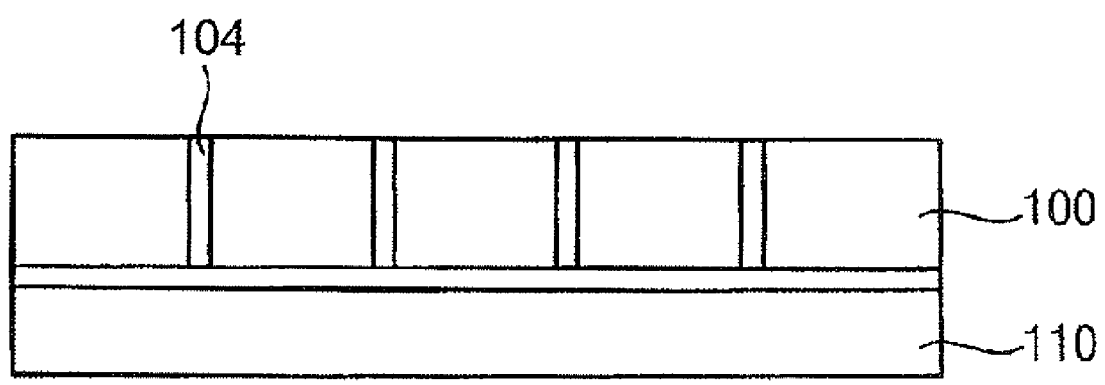
FIG. 10 is a cross-sectional view illustrating a method of cutting a wafer in accordance with another exemplary embodiment of the present general inventive concept.

FIG. 10 is a cross-sectional view illustrating a method of cutting a wafer in accordance with another example embodiment of the present general inventive concept.

Processes substantially the same as those illustrated with reference to FIGS. 1 to 3 are performed to prepare a wafer 100 having the supporting member 110.

Referring to FIG. 10, an opening 104 is formed through a lower surface of the wafer 100 along a scribe lane. In this example embodiment, the opening 104 may be formed through the wafer 100 to expose the supporting member 110 through the opening 104. Thus, only a thickness of the wafer 100 is reduced by a following plasma-etching process.

Processes substantially the same as those illustrated with reference to FIGS. 5 to 9 are performed to divide the wafer 100 into semiconductor chips.

According to the embodiments of the present general inventive concept, a wafer may be plasma-etched without requiring the use of an etching mask. Further, the portions of the wafer affected by high heat of the laser may be cured by the plasma-etching process. Additionally, since a tensile tape which may be prevented from being adhered to the wafer is used, the tensile tape may be easily removed from the semiconductor chips.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of cutting a wafer, comprising:
attaching a supporting member on an upper surface of the wafer having a plurality of semiconductor chips;
forming an opening at a lower surface of the wafer along a scribe lane of the wafer;
plasma-etching the lower surface of the wafer to reduce a thickness of the wafer;
attaching a tensile tape on the lower surface of the wafer, the tensile tape including sequentially stacked tensile films that have a different tensile modulus from each other;
removing the supporting member;
cooling the tensile tape to increase the tensile modulus difference between the tensile films; and
tensing the tensile tape until the tensile films are cut using the tensile modulus difference to separate the tensile tape from the semiconductor chips,
wherein forming the opening comprises forming a preliminary opening, which does not expose the supporting member, from the lower surface of the wafer, and
plasma-etching the lower surface of the wafer comprises removing a portion of the wafer exposed through the preliminary opening to form the opening exposing the supporting member.

2. The method of claim 1, further comprising:
partially removing the lower surface of the wafer supported by the supporting member to reduce the thickness of the wafer.

3. The method of claim 2, wherein the lower surface of the wafer is partially removed by a polishing process.

4. The method of claim 1, further comprising:
detecting positions of the semiconductor chips to identify a position of the scribe lane.

5. The method of claim 4, wherein detecting the positions of the semiconductor chips comprises irradiating an infrared ray to the wafer.

6. The method of claim 1, wherein the opening is formed through the wafer to expose the supporting member through the opening.

7. The method of claim 1, wherein the opening is formed by a laser cutting process.

8. The method of claim 1, wherein the tensile tape is cooled to a temperature of no more than about 10° C.

9. The method of claim 1, wherein the tensile tape comprises:
a first tensile film including a polymer; and
a second tensile film stacked on the first tensile film, the second tensile film including a copolymer.

10. A method of cutting a wafer, comprising:
attaching a supporting member on an upper surface of the wafer having a plurality of semiconductor chips;
polishing a lower surface of the wafer supported by the supporting member to primarily reduce a thickness of the wafer;
detecting positions of the semiconductor chips by irradiating an infrared ray to the wafer to identify a position of the scribe lane;
forming an opening at a lower surface of the wafer along a scribe lane of the wafer by a laser cutting process;
plasma-etching the lower surface of the wafer to secondarily reduce the thickness of the wafer;
attaching a tensile tape on the lower surface of the wafer, the tensile tape including sequentially stacked tensile films that have a different tensile modulus from each other;
removing the supporting member;
cooling the tensile tape to increase the tensile modulus difference between the tensile films; and
tensing the tensile tape until the tensile films are cut using the tensile modulus difference to separate the tensile tape from the semiconductor chips,
wherein the forming the opening comprises forming a preliminary opening, which does not expose the supporting member, from the lower surface of the wafer, and the plasma-etching the lower surface of the wafer comprises removing a portion of the wafer exposed through the preliminary opening to form the opening exposing the supporting member.

11. The method of claim 10, wherein the opening is formed through the wafer to expose the supporting member through the opening.

12. A method of cutting a wafer, comprising:
attaching a supporting member on an upper surface of the wafer having a plurality of semiconductor chips embedded therein;
laser cutting a plurality of openings partly through the wafer at a lower surface thereof along a scribe lane of the wafer;
plasma-etching the lower surface of the wafer to reduce a thickness of the wafer while simultaneously extending the openings cut therein to the supporting member; and
removing the supporting member from the semiconductor chips.

13. The method of claim 12, further comprising:
attaching a material having two layers each of a different tensile modulus to the lower surface of the wafer before removing the supporting member; and
decreasing the temperature of the material having two layers to increase the tensile modulus difference between the two layers to separate the two layers from the semiconductor chips.

* * * * *